United States Patent [19]
Bowhers

[11] Patent Number: 6,133,725
[45] Date of Patent: Oct. 17, 2000

[54] COMPENSATING FOR THE EFFECTS OF ROUND-TRIP DELAY IN AUTOMATIC TEST EQUIPMENT

[75] Inventor: William J. Bowhers, Wayland, Mass.

[73] Assignee: Teradyne, Inc., Boston, Mass.

[21] Appl. No.: 09/048,727

[22] Filed: Mar. 26, 1998

[51] Int. Cl.[7] .................................................... G06F 11/00
[52] U.S. Cl. ............................................................. 324/158.1
[58] Field of Search .............................. 324/158.1, 73.1, 324/765, 763; 714/726, 734, 736, 733; 702/89

[56] References Cited

U.S. PATENT DOCUMENTS

| | | | |
|---|---|---|---|
| 4,523,312 | 6/1985 | Takeuchi et al. | 714/736 |
| 4,646,299 | 2/1987 | Schinabeck et al. | 324/73.1 |
| 4,827,437 | 5/1989 | Blanton | 702/89 |
| 4,908,576 | 3/1990 | Jackson | 371/22.3 |
| 5,682,337 | 10/1997 | El-Fishawy et al. | 324/158.1 |
| 5,682,472 | 10/1997 | Brehm et al. | 395/183.01 |

*Primary Examiner*—Vinh P. Nguyen

[57] ABSTRACT

Improved pin electronics for automatic test equipment are disclosed which compensates for the effects of round-trip delay on signals transmitted by the pin electronics and a circuit under test along the same transmission line. The pin electronics includes a driver and comparator circuitry, both of which are coupled to a transmission line connecting the pin electronics to a node of the circuit under test. Signals produced by the pin electronics and the circuit under test are combined at the pin electronics due to the effects of round-trip delay between the pin electronics and the circuit under test. The comparator circuitry takes a scaled version of the signal produced by the pin electronics and subtracts it from the combined signal, thereby recovering the signal produced by the circuit under test. Other pin electronics are also disclosed that uses the scaled signal for modifying threshold voltages provided to the comparator circuitry, thereby facilitating measurement of the combined signal.

20 Claims, 8 Drawing Sheets

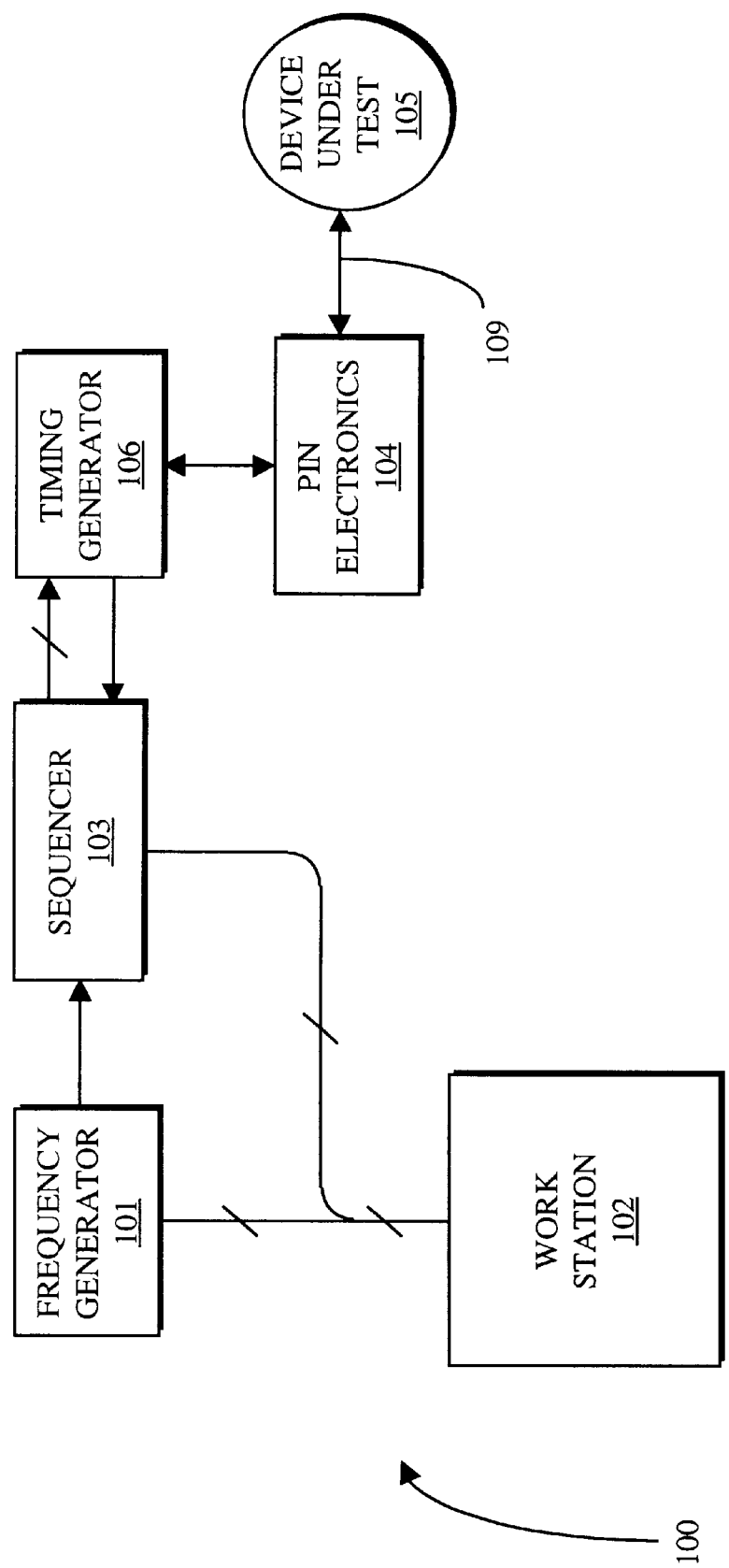
FIG. 1A - PRIOR ART

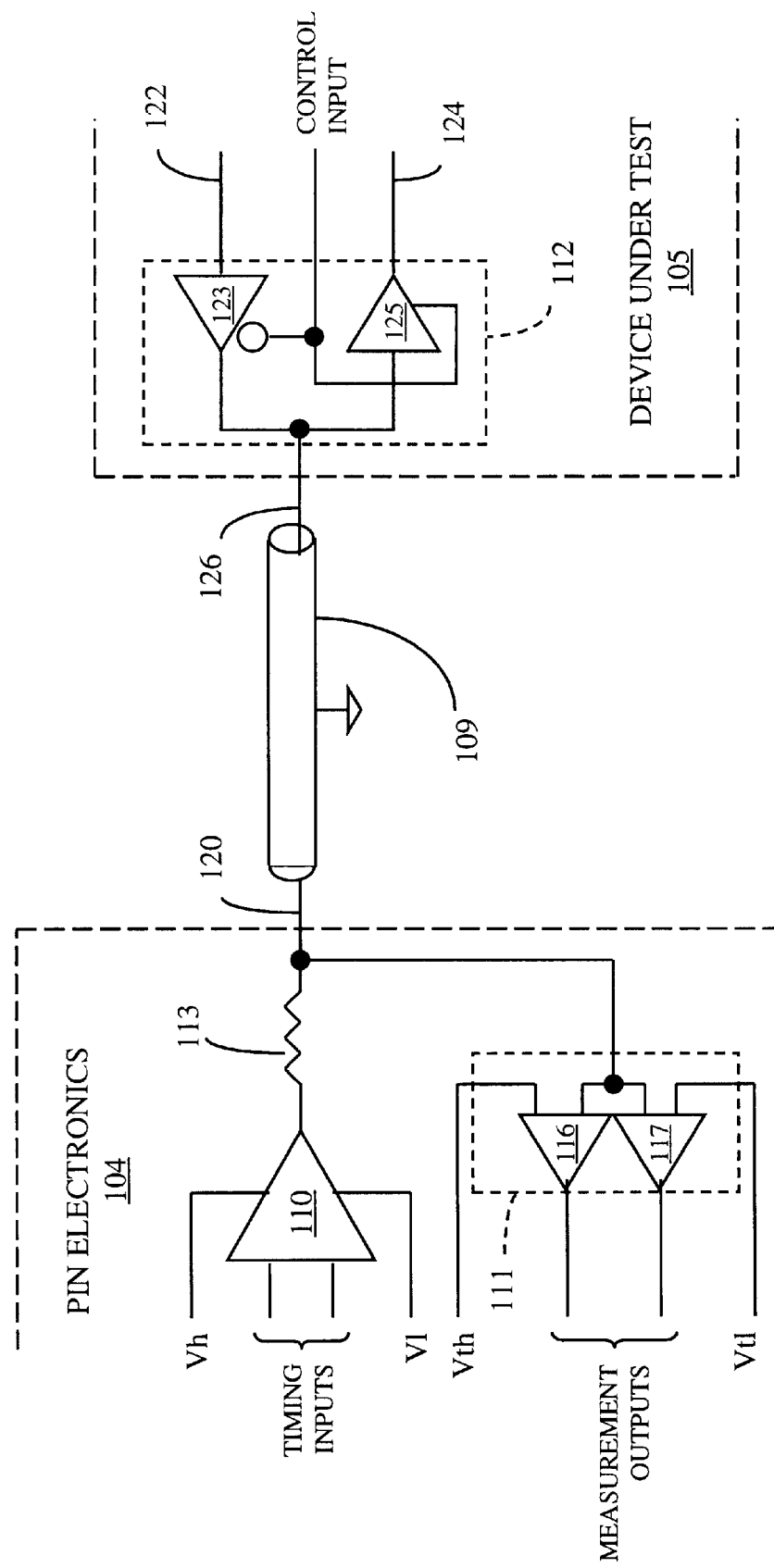
FIG. 1B - PRIOR ART

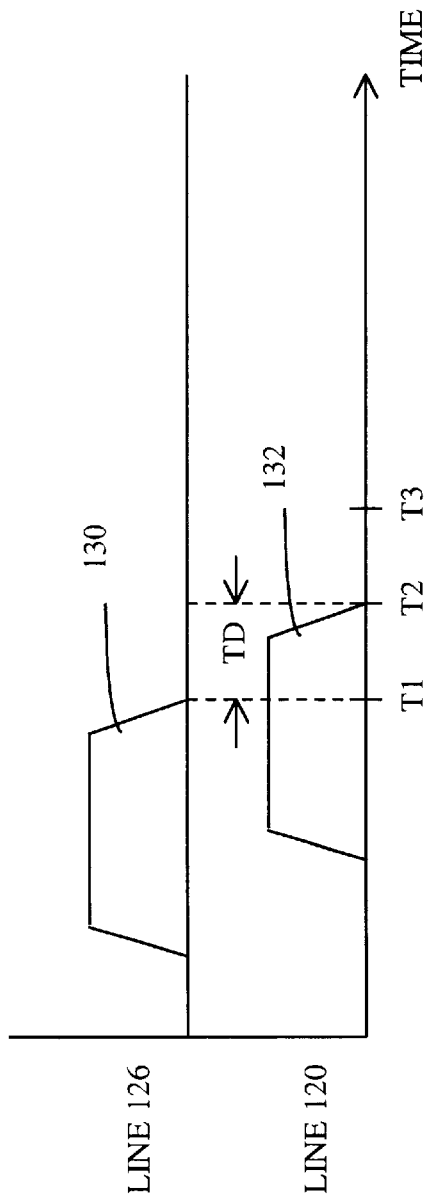
FIG. 1C - PRIOR ART
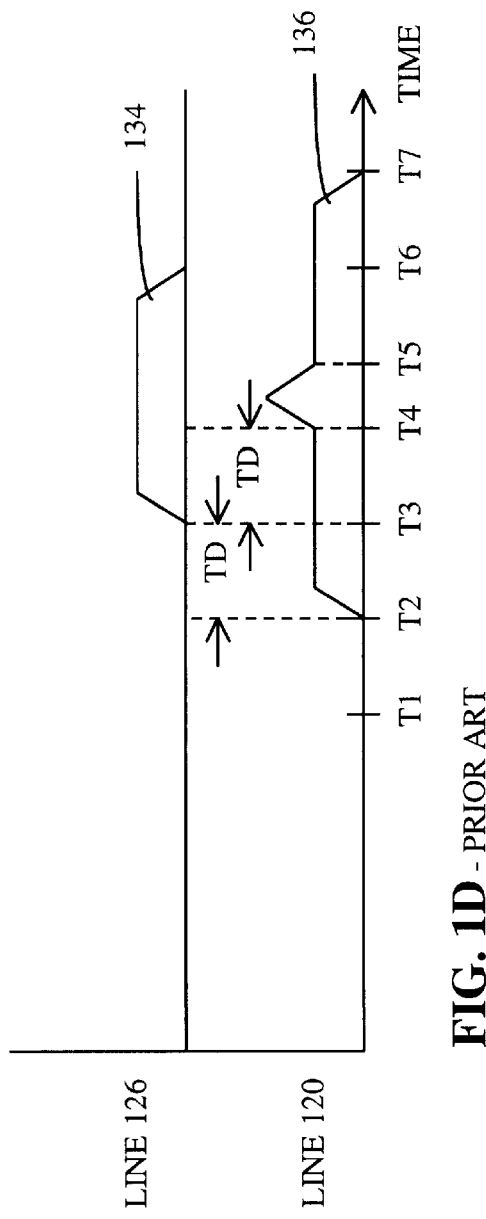
FIG. 1D - PRIOR ART

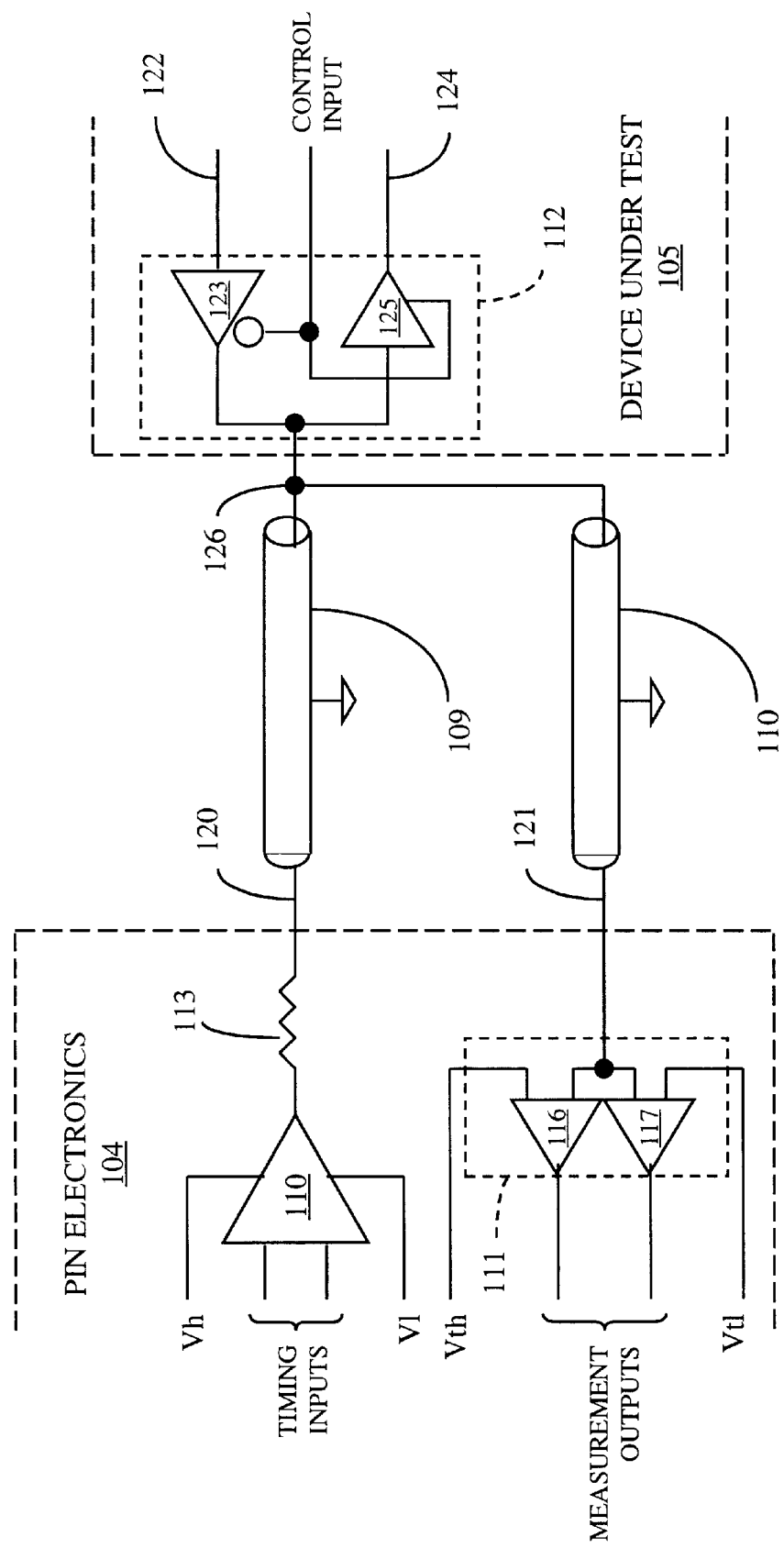
FIG. 1E - PRIOR ART

COMPENSATING FOR THE EFFECTS OF ROUND-TRIP DELAY IN AUTOMATIC TEST EQUIPMENT

This invention relates generally to automatic test equipment, and more particularly to compensating for the effects of round-trip delay on signals transmitted between the automatic test equipment and a device under test.

Automatic test equipment, also known as a tester, is commonly used in the electronics industry to determine whether integrated circuits and other semiconductor devices contain defects.

FIG. 1A shows a partial block diagram of a typical tester 100. In particular, a computer workstation 102 is shown coupled to a frequency generator 101 and a sequencer 103. A test engineer typically uses the computer workstation 102 for entering commands to control the tester 100, for specifying certain operating parameters, and for developing test patterns, which generally include a series of test vectors. For example, the test engineer may specify the frequency of a clock produced by the frequency generator 101, thereby specifying the length or period of a test cycle. Further, the test engineer may enter commands for loading a test pattern into a memory (not shown) included in the sequencer 103, and for starting and stopping a test. As a result, during each test cycle, a processor (not shown) in the sequencer 103 reads one of the test vectors from the memory and then sends the information derived therefrom to a timing generator 106, which uses the information to produce edges at precisely specified times. These timing edges are then provided to pin electronics 104.

The tester 100 typically includes a plurality of pin electronics, each one coupled to one of the nodes of a device under test (DUT) 105. For simplicity, just the pin electronics 104 is shown. Further, a tester pin (not shown) typically connects the pin electronics 104 to a respective node of the DUT 105 through a transmission line 109.

In a conventional test configuration, the pin electronics 104 applies test signals to nodes of the DUT 105, detects output signals produced by the DUT 105 in response to the applied test signals, and compares the detected output signals with expected values at times dictated by the timing edges provided by the timing generator 106. If the detected output signals do not match the expected values, then the tester 100 generally indicates that the DUT 105 is defective.

FIG. 1B shows a partial schematic of the pin electronics 104, the DUT 105, and the transmission line 109 that connects them. The timing edges provided by the timing generator 106 are typically used to control a driver 110 for producing a test signal. This test signal typically passes through a back-match resistor 113 and the transmission line 109 until it reaches the DUT 105. The test signal may then pass through a bi-directional pad 112 to a line 124 in the DUT 105.

Further, the DUT 105 may apply an output signal to a line 122. This output signal typically passes through the bi-directional pad 112 and the transmission line 109 until it reaches the pin electronics 104. Other timing edges then typically control a comparator 111, which compares the output signal with specified voltage thresholds.

The circuitry interconnecting the pin electronics 104 and the DUT 105 generally introduces some amount of delay time to both the test signal and the output signal. This delay time is shown in the timing diagram of FIG. 1C. For example, LINE 126 includes a pulse 130, which depicts an output signal generated by the DUT 105. Further, LINE 120 includes a pulse 132, which depicts the output signal after it has passed through the transmission line 109. The pulse 132 is shown delayed by the time TD, which is the amount of time between times T1 and T2.

Similarly, FIG. 1D shows LINE 120 with a test signal 136, which is meant to depict a test signal after it has passed through the back-match resister 113 and combined with a reflected version of the test signal 136, which is reflected back from the DUT 105. This is a conventional depiction of a test signal produced by a back-matched driver such as the driver 110. Further, LINE 126 includes a pulse 134, which depicts the test signal 136 after it has passed through the transmission line 109. This pulse 134 is also shown delayed by the time TD, which is the amount of time between times T2 and T3.

Accordingly, FIG. 1C in conjunction with FIG. 1D show that the generated output signal 130 and the delayed test signal 134 are separated in time by twice the delay TD or 2TD, which is the amount of time between times T1 and T3. This is commonly known as the round-trip delay between the pin electronics 104 and the DUT 105.

It follows that if the generated output signal 130 and the delayed test signal 134 were separated in time by less than the round-trip delay, then the delayed output signal 132 and the test signal 136 on LINE 120 would overlap or "collide" during the time interval from T1 to T3, thereby making it very difficult for the tester 100 to detect the output signal 132.

This significantly limits the programming flexibility of a tester, especially when testing high-speed electronic circuitry. For example, the test engineer must take into account the round-trip delay associated with each node of the DUT when programming the tester to prevent any applied test signals from possibly interfering with detected output signals. This affects the speed at which the bi-directional pad 112 switches from a transmitting mode to a receiving mode; the speed at which the tester can produce a new test signal after receiving an output signal on the same transmission line; and, the proximity of edges controlling the comparator 111 and the driver 110 in successive test cycles.

One way of compensating for the effects of round-trip delay in testers is known as the "fly-by" configuration. As shown in FIG. 1E, the driver 110 is connected to the bi-directional pad 112 through the transmission line 109 as before. However, the bi-directional pad 112 is now connected to the comparator 111 through a second transmission line 110. As a result, the pin electronics 104 applies test signals to the DUT 105 using the transmission line 109, and detects output signals from the DUT 105 using the transmission line 110. Because the test signals and the output signals are applied and detected, respectively, using different transmission lines, signal collisions at the pin electronics 104 are avoided.

However, this approach also has several drawbacks. For example, providing two transmission lines at each node of the DUT not only increases tester costs substantially but also essentially doubles the load at each node. Further, because the respective delay times introduced to the test signals and the output signals may now have different values, the timing calibration of the tester generally becomes much more complex.

It would therefore be desirable to have a method of compensating for the effects of round-trip delay in testers that overcomes these drawbacks.

SUMMARY OF THE INVENTION

With the foregoing background in mind, it is an object of the invention to provide a tester that can test high-speed electronic circuits.

Another object of the invention is to provide a tester that inexpensively compensates for the effects of round-trip delay.

Still another object of the invention is to provide a tester that has a high level of programming flexibility.

The foregoing and other objects are achieved in a tester having pin electronics with driver circuitry for producing test signals and comparator circuitry for detecting corresponding output signals produced by a circuit under test. In one embodiment, the comparator circuitry includes circuitry for subtracting a scaled version of the test signals from the corresponding output signals.

In another embodiment, the comparator circuitry includes circuitry for adding a scaled version of the test signals to the comparator threshold voltages.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1A is a partial block diagram of a conventional tester, FIG. 1B is a partial schematic diagram of the pin electronics used with FIG. 1A and a device under test, FIGS. 1C and 1D are timing diagrams depicting test signals generated by the FIG. 1A apparatus and output signals produced by the device under test, FIG. 1E is a partial schematic diagram of another embodiment of the FIG. 1B apparatus.

DESCRIPTION OF THE PREFERRED EMBODIMENT

Figure 2A:
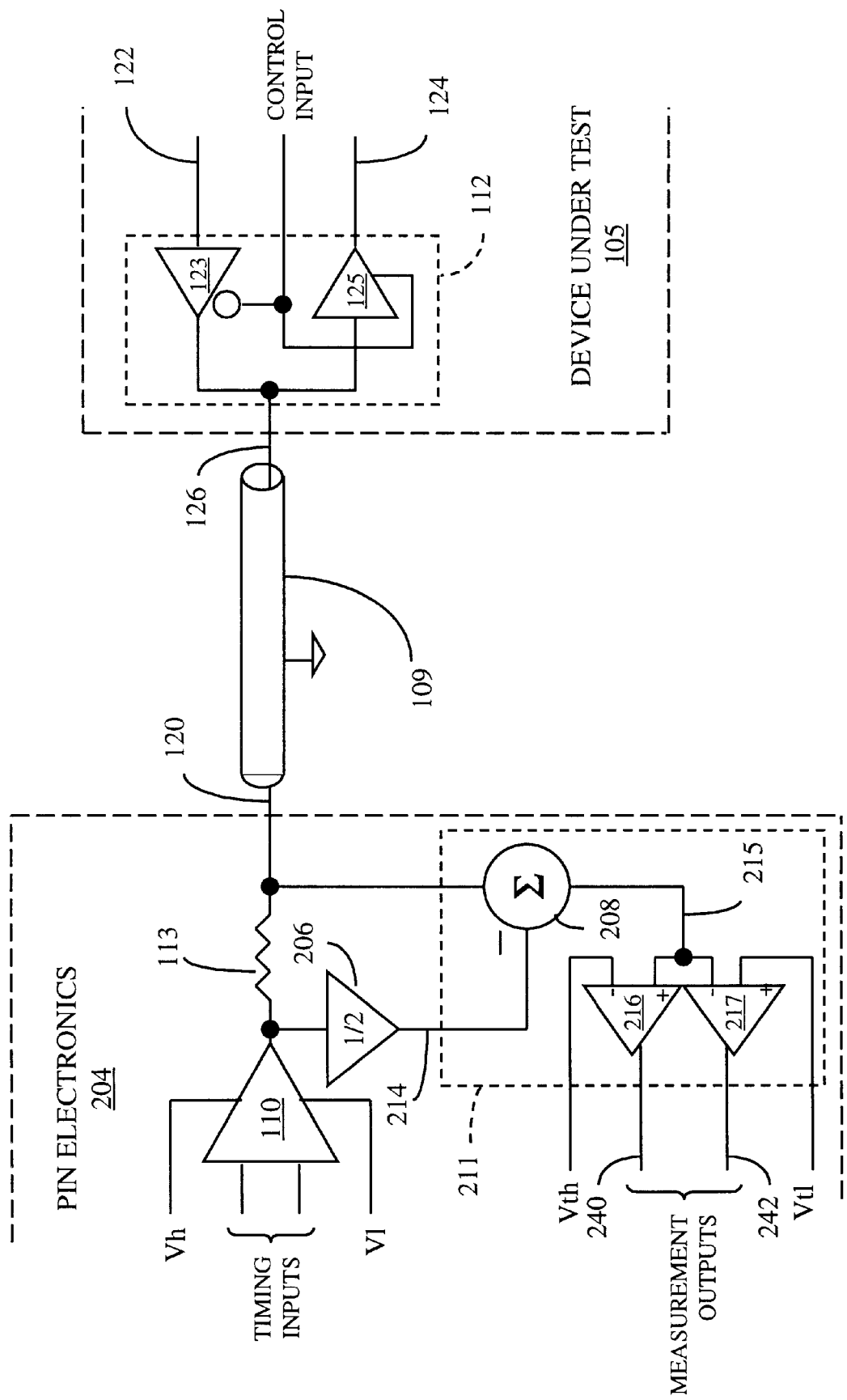
FIG. 2A is a partial schematic diagram of pin electronics incorporating compensation circuitry in accordance with the present invention.

FIG. 2A shows a partial schematic of pin electronics 204 according to the present invention. The pin electronics 204 is an improvement of the pin electronics 104 shown in FIG. 1A. Accordingly, the pin electronics 204 may be used in place of the pin electronics 104 to test high-speed semiconductor devices.

The preferred tester configuration includes a plurality of pin electronics 204, each one coupled to one of the nodes of the DUT 105. For example, the pin electronics 204 is coupled to a node of the DUT 105 in a conventional manner by the transmission line 109, which may be a coaxial cable.

A timing generator such as the timing generator 106 (FIG. 1A) includes timing generator and interpolator circuitry (not shown) that produce timing edges (not shown) for controlling a driver 110 and a comparator 211. The timing edges are produced in a conventional manner using information derived from test vectors provided by a sequencer such as the sequencer 103 (FIG. 1A). The use of test vectors for producing timing edges in a tester is well known to those skilled in this art.

The driver 110 produces test signals at times that are precisely specified by the timing edges. Each test signal passes through a back-match resistor 113 and the transmission line 109 to the DUT 105. Each test signal may then pass through a pad such as the bi-directional pad 112 to a line 124 in the DUT 105.

Accordingly, the state of the CONTROL INPUT of the bi-directional pad 112 is such that the bi-directional pad 112 is in a receiving mode. In this case, a buffer 125 coupled between lines 124 and 126 is active and a buffer 123 coupled between lines 122 and 126 is inactive. At other times, the state of the CONTROL INPUT may place the bi-directional pad 112 in a transmitting mode. In this case, the buffer 123 is active and the buffer 125 is inactive.

In a typical tester configuration, other pin electronics (not shown) may be coupled to other nodes (not shown) of the DUT 105 for controlling the operation of the DUT 105. These other pin electronics may be used to control the state of the CONTROL INPUT of the bi-directional pad 112, thereby determining whether the bi-directional pad 112 operates in the receiving or the transmitting mode.

The DUT 105 provides output signals on line 122. The output signals may be provided by the DUT 105 in response to the test signals produced by the driver 110, or some other test or control signals produced by the other pin electronics.

Each output signal passes through the buffer 123. Accordingly, the state of the CONTROL INPUT places the bi-directional pad 112 in a transmitting mode. Further, the output signal passes through the transmission line 109 until it reaches the pin electronics 204.

As mentioned above, the pin electronics 204 includes the back-match resistor 113, which matches the input impedance of the pin electronics 204 to the characteristic impedance of the transmission line 109. This means that any signals passing through the transmission line 109 to the pin electronics 204 will not be reflected back through the transmission line 109 to the DUT 105. The transmission line 109 typically has a characteristic impedance equal to 50Ω. Accordingly, the back-match resistor 113 typically has a value of 50Ω.

However, the input impedance of the DUT 105 typically does not match the characteristic impedance of the transmission line 109. This means that any signals passing through the transmission line 109 to the DUT 105 may be reflected back to the pin electronics 204 at the tester.

Effects of this phenomenon are shown in FIG. 1D. For example, LINE 120 includes a signal 136, which is a combination of a test signal generated by the driver 110 and a reflected version of the test signal, which is reflected back from the DUT 105. The generated test signal occurs between times T2 and T5, and the reflected test signal occurs between times T4 and T7. Further, the leading edge of the generated test signal at time T2 and the leading edge of the reflected test signal at time T4 are separated by the round-trip delay, i.e. 2TD. This is the time required for the test signal to propagate from the line 120 (FIG. 2A) at the tester to the line 126 (FIG. 2A) at the DUT 105, and back to the line 120.

Accordingly, the generated test signal and the reflected test signal overlap or "collide" during the time interval between T4 and T5. The effects of this collision are shown by the shape of the signal 136 from T4 to T5. It should be noted that the back-match resistor 113 attenuates the amplitude of the signal 136 by about one-half in this illustrative example.

In contrast, FIG. 1C shows LINE 126, which depicts an output signal 130 produced by the DUT 105. This signal 130 is not combined with a reflected version of the output signal 130 because the back-match resistor 113 in the pin electronics 204 prevents any signals from being reflected back to the DUT 105.

The pin electronics 204 also includes scaling circuitry 206 and comparator circuitry 211, which will be described in conjunction with the timing diagram shown in FIG. 2B. In particular, LINE 126 depicts both the output signal 130 produced by the DUT 105 and a delayed test signal 134 at the connection between the transmission line 109 and the DUT 105. As mentioned above, the output signal 130 may be provided by the DUT 105 in response to test or control signals produced by the pin electronics 204. Further, the delayed test signal 134 is the test signal 134 delayed by the amount of time required for a test signal to propagate from the line 120 at the tester, through the transmission line 109, and to the line 126 at the DUT 105. This time delay is equal to one-half of the round-trip delay, i.e. TD.

Moreover, LINE 120 includes a signal 250, which is a combination of the output signal 130 delayed by one-half of the round-trip delay (TD) and the test signal 134 at the connection between the pin electronics 204 and the transmission line 109. The delayed output signal 130 occurs between times T1 and T5, and the test signal 134 at the pin electronics 204 occurs between times T3 and T7. It should be noted that the test signal 134 at the pin electronics 204 is also combined with a version of the test signal 134 reflected back from the DUT 105.

Accordingly, the delayed output signal 130 and the test signal 134 at the pin electronics 204 overlap or "collide" during the time interval between T3 and T5, thereby making it very difficult for the pin electronics 204 to detect the delayed output signal 130. This is because the output signal 130 and the delayed test signal 134 at the DUT 105 are separated in time by less than the round-trip delay. In this illustrative example, the output signal 130 and the delayed test signal 134 are separated in time by one-half of the round-trip delay, i.e. TD.

An important advantage of the present invention is derived from the scaling circuitry 206 and the comparator circuitry 211. As shown in FIG. 2B, LINE 214 includes a signal 252, which is a scaled version of the test signal produced by the driver 110. This signal is preferably identical to the test signal that appears as the delayed test signal 134 on LINE 126 at the DUT 105. This signal is also preferably identical to the test signal that is combined with the delayed output signal and the reflected test signal on LINE 120 at the pin electronics 204. Because the back-match resistor 113 attenuates the test signal by one-half in this illustrative example, the scaling circuitry 206 scales the test signal by one-half to produce the signal 252.

Figure 2B:
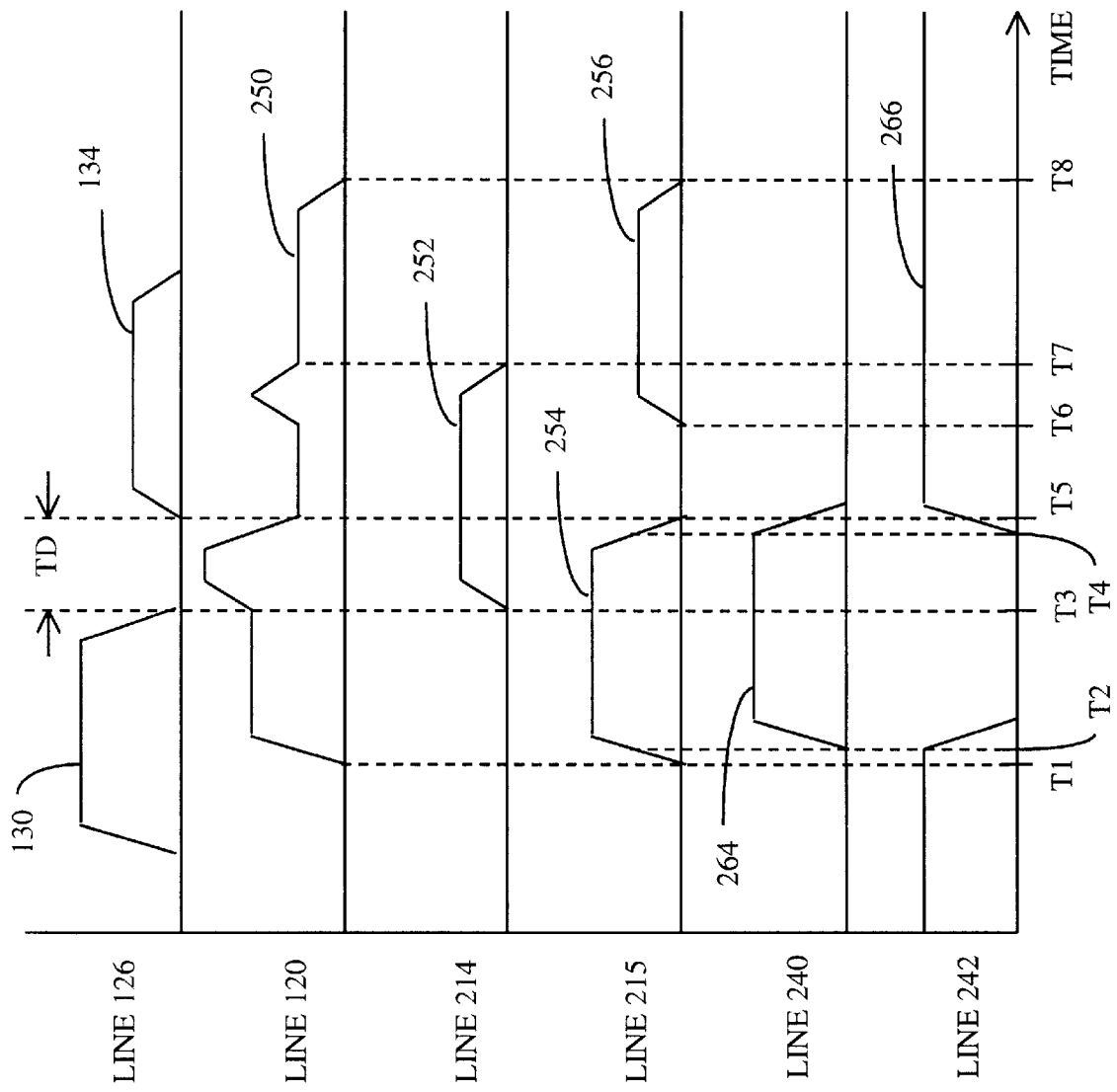
FIG. 2B is a timing diagram describing compensation for the effects of round-trip delay using the FIG. 2A apparatus.

The signal 250 on LINE 120 and the signal 252 on LINE 214 are provided to the comparator circuitry 211 and are combined by summing circuitry 208, the output of which is shown on LINE 215 of FIG. 2B. The summing circuitry 208 first inverts the signal 252, and then adds the inverted signal 252 to the combined signal 250. In effect, the summing circuitry 208 subtracts the scaled test signal 252 from the combined signal 250.

Accordingly, LINE 215 shows that the output of the summing circuitry 208 includes signals 254 and 256. The signal 254 is the delayed output signal 130, which is recovered from the combined signal 250. Further, the signal 256 is the reflected test signal, which is also recovered from the combined signal 250. These signals 254 and 256 are then provided to comparators 216 and 217, which may compare one or both of the signals 254 and 256 with a selected high threshold level, Vth, and a selected low threshold level, Vtl, respectively.

For example, LINE 240 and LINE 242 show typical outputs generated by the comparators 216 and 217, respectively. For this illustrative example, the threshold levels Vth and Vtl are selected to be the same. Accordingly, LINE 240 shows a comparator output 264, which goes high when the leading edge of the signal 254 crosses Vth at approximately time T2 and goes low when the falling edge crosses Vth at approximately time T4. Further, LINE 242 shows a comparator output 266, which goes low when the leading edge of the signal 254 crosses Vtl at approximately time T2 and goes high when the falling edge crosses Vtl at approximately time T4.

The important advantage of the present invention is that an output signal produced by the DUT can be detected at the tester even if the output signal and a test signal, which is subsequently transmitted by the tester along the same transmission line, are separated in time at the DUT by less than the total round-trip delay. As shown in FIG. 2B, the output signal 130 and the test signal 134 are separated in time on LINE 126 by only one-half of the round-trip delay. This dictates that the delayed output signal and the test signal will overlap or collide on LINE 120 at the tester. Nevertheless, the undistorted signal 254, which represents the output signal 130 at the tester, is provided to the comparators 216 and 217 on LINE 215 for subsequent detection and comparison.

This enhances the programming flexibility of the tester. For example, the test engineer no longer needs to consider the round-trip delay associated with a particular transmission line when providing a test signal to the line after receiving an output signal from the DUT on the same line. This is because even if the test signal overlaps or collides with the received output signal, the improved pin electronics can still successfully detect the received output signal.

Also, a bi-directional pad in the DUT can be made to switch between transmitting and receiving modes at a faster rate. This is because an output signal followed by a test signal on the same line at the DUT no longer need to be separated by at least the round-trip delay for that line.

Also, timing edges for controlling driver and comparator circuitry in the pin electronics can be placed closer together in successive test cycles. For example, a first timing edge may cause the comparator circuitry to start comparing an output signal during one test cycle, while a second timing edge may cause the driver circuitry to start applying a test signal to the same line during a next test cycle. With the present invention, the first and second timing edges can be specified without regard to whether the output signal and the test signal overlap at the tester end of the line.

Having described one embodiment, numerous alternative embodiments or variations might be made. For example, it was described that the pin electronics according to the invention may be used in place of the pin electronics 104 (FIG. 1A) to test high-speed semiconductor devices. However, this is merely an illustration. The pin electronics of the invention may be used with any suitable tester configuration.

Also, it was described that the back-match resistor 113 (FIG. 2A) attenuates the test signal by one-half, and therefore the scaling circuitry 206 (FIG. 2A) scales the test signal by one-half. However, this is also merely an illustration. The back-match resistor and the scaling circuitry may scale the test signal by any suitable amount.

Also, it was described that the summing circuitry in the pin electronics inverts the scaled test signal before performing a summing operation. However, this is merely an illustration. The scaling circuitry or some other circuitry may invert the scaled test signal instead, and then provide the inverted and scaled test signal to the summing circuitry.

Also, it was described that the comparator circuitry compares one or both of the recovered output signal and reflected test signal with selected high and low threshold voltages. However, this is also merely an illustration. During typical test sessions, the reflected test signal, which is recovered by the comparator circuitry, is ignored.

Figure 3A:
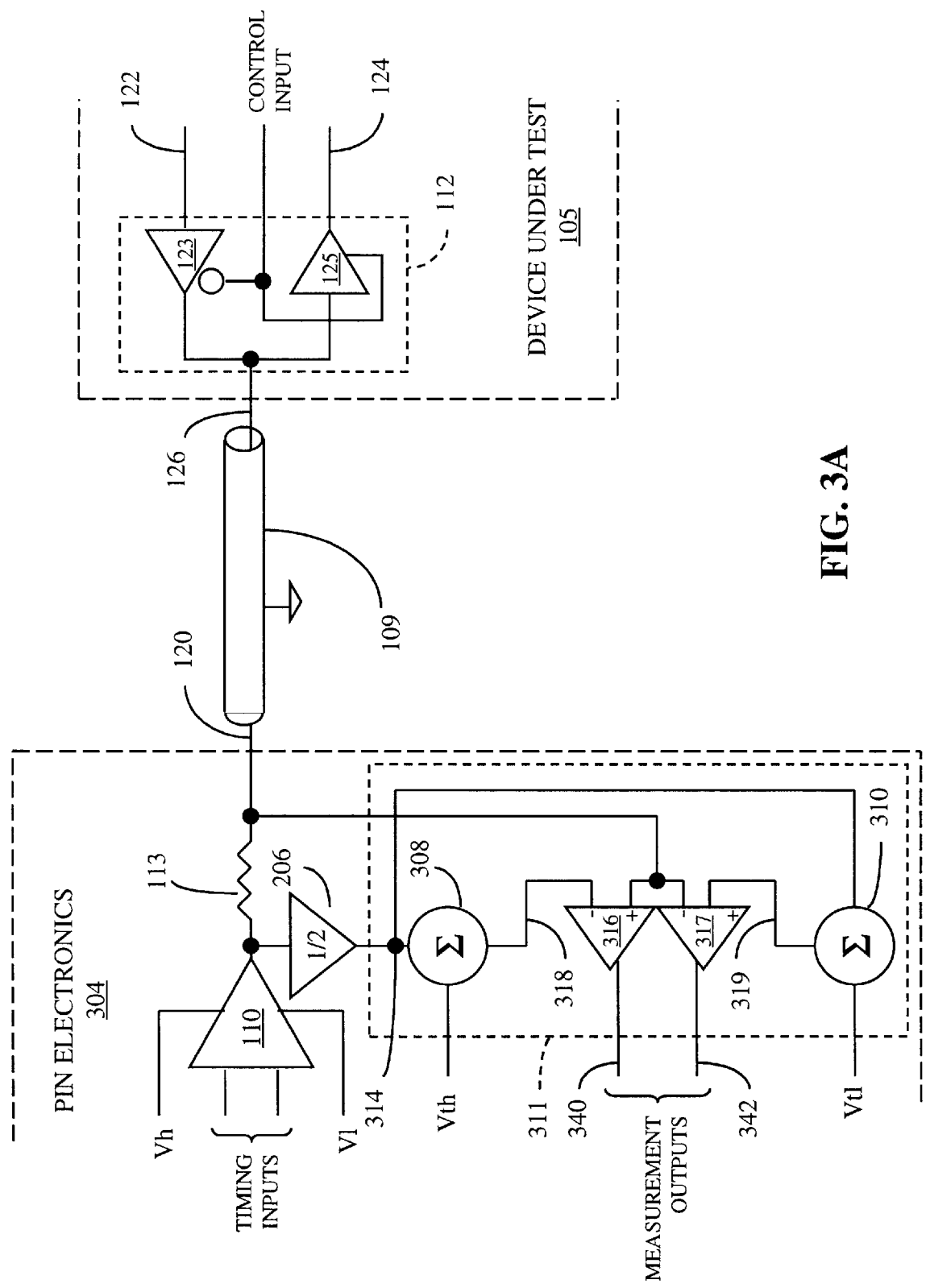
FIG. 3A is a partial schematic diagram of another embodiment of the FIG. 2 apparatus.

Also, an alternative embodiment of the improved pin electronics is shown in FIG. 3A. In particular, pin electronics 304 is coupled to the DUT 105 by the transmission line 109 in the conventional manner. Further, the pin electronics 304 includes the driver 110, the scaling circuitry 206, the backmatch resistor 113, and comparator circuitry 311, which cooperate in a manner that is similar to the corresponding elements in the pin electronics 204.

However, whereas the comparator circuitry 211 used in the pin electronics 204 effectively subtracts a scaled test signal from a combined signal to recover an output signal from the DUT, the comparator circuitry 311 uses the scaled test signal to adjust the selected high and low threshold voltages to perform useful comparisons of a distorted output signal.

Figure 3B:
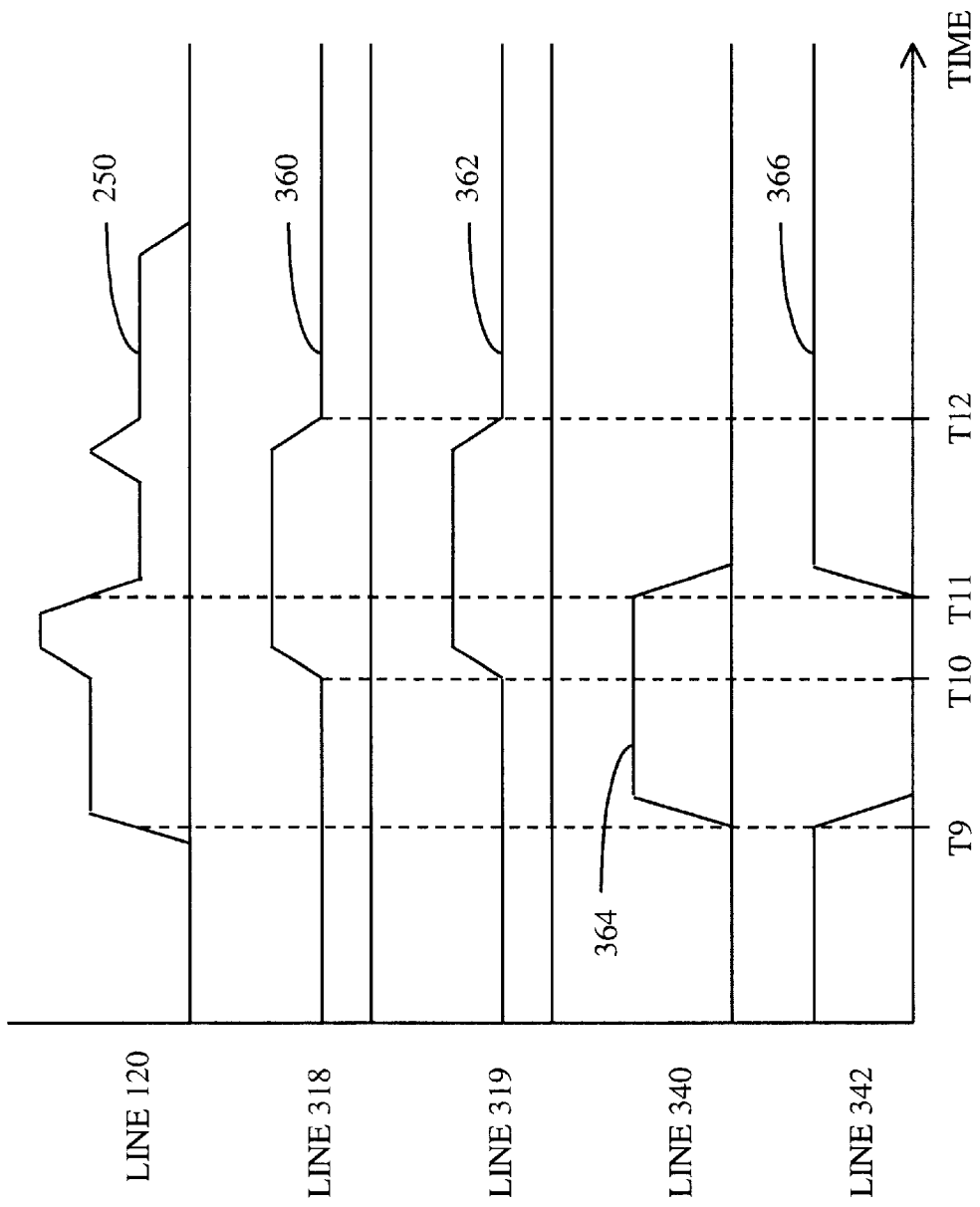
FIG. 3B is a timing diagram describing compensation for the effects of round-trip delay using the FIG. 3A apparatus.

For example, FIG. 3B shows LINE 120 with a signal 250, which depicts a combination of the DUT output signal, the scaled test signal, and the scaled test signal reflected from the DUT. Further, the scaled test signal on line 314 and the high threshold level, Vth, are provided to the comparator circuitry 311 and are combined by summing circuitry 308, the output of which is shown on LINE 318 of FIG. 3B. The low threshold level, Vtl, is also provided to the comparator circuitry 311 and is combined with the scaled test signal by summing circuitry 310, the output of which is shown on LINE 319 of FIG. 3B.

Accordingly, the scaled test signal is added to the constant threshold voltages Vth and Vtl during the time interval from T10 to T12. The summing circuits 308 and 310 place these modified threshold levels 360 and 362 on lines 318 and 319, respectively, for subsequent use by comparators 316 and 317. The values of the threshold voltages Vth and Vtl are the same for this illustrative example.

The combined signal 250 is also provided to the comparator circuitry 311. Further, the comparator 316 compares the combined signal 250 with the modified high threshold level 360 on line 318. As a result, FIG. 3B shows that LINE 340, which is the output of the comparator 316, goes high when the leading edge of the distorted output signal crosses the high threshold level 360. This occurs at time T9. Further, LINE 340 goes low when the falling edge of the distorted output signal crosses the high threshold level 360. This occurs at time T11.

Similarly, the comparator 317 compares the combined signal 250 with the modified low threshold level 362 on line 319. As a result, FIG. 3B shows that LINE 342, which is the output of the comparator 317, goes low when the leading edge of the distorted output signal crosses the low threshold level 362 at time T9. Further, LINE 342 goes high when the falling edge of the distorted output signal crosses the low threshold level 362 at time T11.

Even though the falling edge of the DUT output signal is distorted due to the overlap of the output signal and the scaled test signal, the comparator circuitry 311 can still successfully detect this edge. This is because the comparator circuitry 311 modifies the threshold levels to account for the distortion.

Therefore, the invention should be limited only by the spirit and scope of the appended claims.

What is claimed is:

1. A tester, having a plurality of pin electronics channels for coupling to a device under test, each of the plurality of pin electronics channels comprising:

a driver circuit having an output adapted to be coupled to the device under test;

a scaling circuit having an input and an output, the input of the scaling circuit coupled to the output of the driver circuit; and a comparator circuit having a first input coupled to the output of the driver circuit and a second input coupled to the output of the scaling circuit, the comparator circuit including means for generating at least one measurement output indicative of a signal generated by the device under test and substantially independent of a voltage at the output of the driver circuit.

2. A tester as recited in claim 1, further comprising a backmatch resistor coupled between the first and second inputs of the comparator circuit.

3. A tester as recited in claim 2, wherein the pin electronics channel is adapted to be coupled to the device under test via a transmission line, and the resistance of the backmatch resistor is substantially equals the characteristic impedance of the transmission line.

4. A tester as recited in claim 1, wherein the means for generating at least one measurement output comprises:

a subtracting circuit having a first input coupled to the first input of the comparator circuit and a second input coupled to the second input of the comparator circuit, and generating an output signal indicative of a difference between the first and second inputs of the subtracting circuit; and a comparator having a first input coupled to the output of the subtracting circuit, a second input receiving a threshold signal, and generating a measurement output.

5. A tester as recited in claim 4, wherein the comparator is a first comparator, and the means for generating at least one measurement output further comprises:

a second comparator having a first input coupled to the output of the subtracting circuit, a second input receiving to a second threshold signal, and generating a second measurement output.

6. A tester as recited in claim 1, wherein the means for generating at least one measurement output comprises:

a summing circuit having a first input coupled to the second input of the comparator circuit and a second input receiving a first threshold signal, and generating an output signal indicative of a sum of signal levels of the first and second inputs of the summing circuit; and a comparator having a first input coupled to the output of the summing circuit, a second input coupled to the first input of the comparator circuit, and generating a measurement output.

7. A tester as recited in claim 6, wherein the summing circuit is a first summing circuit and the comparator is a first comparator, and the means for generating at least one measurement output further comprises:

a second summing circuit having a first input coupled to the second input of the comparator circuit and a second input receiving a second threshold signal, and generating an output signal indicative of a sum of signal levels of the first and second inputs of the second summing circuit; and a second comparator having a first input coupled to the output of the second summing circuit, a second input coupled to the first input of the comparator circuit, and generating a second measurement output.

8. Pin electronics for automatic test equipment, comprising:

a driver circuit having an output adapted to be coupled to a device under test;

a scaling circuit having an input and an output, the input of the scaling circuit coupled to the output of the driver circuit; and a comparator circuit having a first input coupled to the output of the driver circuit and a second input coupled to the output of the scaling circuit, the comparator circuit including means for generating at least one measurement output indicative of a signal generated by the device under test and substantially independent of a voltage at the output of the driver circuit.

9. Pin electronics as recited in claim 8, further comprising a backmatch resistor coupled between the first and second inputs of the comparator circuit.

10. Pin electronics as recited in claim 9, wherein the pin electronics channel is adapted to be coupled to the device under test via a transmission line, and the resistance of the backmatch resistor is substantially equals the characteristic impedance of the transmission line.

11. Pin electronics as recited in claim 8, wherein the means for generating at least one measurement output comprises:

a subtracting circuit having a first input coupled to the first input of the comparator circuit and a second input coupled to the second input of the comparator circuit, and generating an output signal indicative of a difference between the first and second inputs of the subtracting circuit; and a comparator having a first input coupled to the output of the subtracting circuit, a second input receiving a threshold signal, and generating a measurement output.

12. Pin electronics as recited in claim 11, wherein the comparator is a first comparator, and the means for generating at least one measurement output further comprises:

a second comparator having a first input coupled to the output of the subtracting circuit, a second input receiving to a second threshold signal, and generating a second measurement output.

13. Pin electronics as recited in claim 8, wherein the means for generating at least one measurement output comprises:

a summing circuit having a first input coupled to the second input of the comparator circuit and a second input receiving a first threshold signal, and generating an output signal indicative of a sum of signal levels of the first and second inputs of the summing circuit; and a comparator having a first input coupled to the output of the summing circuit, a second input coupled to the first input of the comparator circuit, and generating a measurement output.

14. A tester as recited in claim 13, wherein the summing circuit is a first summing circuit and the comparator is a first comparator, and the means for generating at least one measurement output further comprises:

a second summing circuit having a first input coupled to the second input of the comparator circuit and a second input receiving a second threshold signal, and generating an output signal indicative of a sum of signal levels of the first and second inputs of the second summing circuit; and a second comparator having a first input coupled to the output of the second summing circuit, a second input coupled to the first input of the comparator circuit, and generating a second measurement output.

15. A method of operating a tester, the tester being connected to a circuit under test by a transmission line, comprising the steps of:

(a) receiving a signal at a connection between the tester and the transmission line, a signal received thereby including a drive signal produced by the tester and an output signal produced by the circuit under test;

(b) generating a signal proportional to the drive signal produced by the tester but substantially independent of the output signal produced by the circuit under test;

(c) subtracting the signal proportional to the drive signal generated in step b from the signal received in step a, to generate a recovered output signal that is substantially independent of the drive signal; and (d) comparing the recovered output signal with at least one expected value.

16. A method as recited in claim 15, further comprising controlling the circuit under test to cause it to assume one of a transmitting state and a receiving state.

17. A method as recited in claim 16, wherein the step of controlling includes operating a channel of the tester to cause the circuit under test to assume said one of the transmitting state and receiving state.

18. A method as recited in claim 17, further comprising causing the channel of the tester to repetitively cause the circuit under test to change between said receiving state and said transmitting state at intervals shorter than a round-trip delay through the transmission line.

19. A method as recited in claim 15, further comprising causing the circuit under test to repetitively change between a receiving state and a transmitting state at intervals shorter than a round-trip delay through the transmission line.

20. A method as recited in claim 15, wherein the step d of comparing includes applying the recovered output signal to an input of at least one comparator circuit.

* * * * *